United States Patent
Muthali et al.

(10) Patent No.: US 10,419,041 B2
(45) Date of Patent: Sep. 17, 2019

(54) POWER-GOOD DETECTOR FOR ULTRA-WIDE BAND TRANSMITTER WITH EMPHASIS ON LOW POWER CONSUMPTION

(71) Applicant: Maxim Integrated Products, Inc., San Jose, CA (US)

(72) Inventors: Harish S. Muthali, San Jose, CA (US); Kourosh Pahlavan, Cupertino, CA (US); Ari Vauhkonen, Mountain View, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 19 days.

(21) Appl. No.: 15/570,108

(22) PCT Filed: Apr. 28, 2016

(86) PCT No.: PCT/US2016/029858
§ 371 (c)(1),
(2) Date: Oct. 27, 2017

(87) PCT Pub. No.: WO2016/176492
PCT Pub. Date: Nov. 3, 2016

(65) Prior Publication Data
US 2018/0145706 A1 May 24, 2018

Related U.S. Application Data (60) Provisional application No. 62/154,872, filed on Apr. 30, 2015.

(51) Int. Cl.
*H04B 1/04* (2006.01)
*G01R 31/317* (2006.01)
(Continued)

(52) U.S. Cl.
CPC .......... *H04B 1/04* (2013.01); *G01R 31/31725* (2013.01); *G06F 1/3234* (2013.01);
(Continued)

(58) Field of Classification Search
CPC .... H04B 1/04; H04B 1/7174; H04B 1/71632; H04B 1/0475; G06F 1/3234; G01R 31/31725
See application file for complete search history.

(56) References Cited

U.S. PATENT DOCUMENTS

| | | | | |
|---|---|---|---|---|
| 5,847,552 A | * | 12/1998 | Brown | .............. G05F 1/465 |
| | | | | 323/281 |
| 6,026,125 A | | 2/2000 | Larrick, Jr. et al. | |

(Continued)

FOREIGN PATENT DOCUMENTS

WO 2005053340 A1 6/2005

OTHER PUBLICATIONS

International Search Report dated Aug. 9, 2016, in International Patent Application No. PCT/US2016/029858, filed Apr. 28, 2016 (3pgs).

(Continued)

*Primary Examiner* — Jean B Corrielus
(74) *Attorney, Agent, or Firm* — North Weber & Baugh LLP (57) ABSTRACT

Systems, devices and methods are disclosed using a transmitter architecture to keep the transmitter in a deep sleep mode before activation/enabling. The transmitter tag comprises a power-good-detector, a first regulator and a second regulator. The power-good-detector includes a power-good-latch, a ring oscillator and a ripple counter. Upon disconnecting a GPIO pin from the ground, the power-good-latch sends a Bias_EN signal to the regulator. Upon receipt of the Bias_EN signal, the first regulator transmits a wakeup signal (Continued)

to the ring oscillator, which then starts sending the clock signals to the ripple counter. When the counted clock signals reach a threshold value, the ripple counter sends the power-good-digital signal to the flip flops. When the tag is in the reset mode, the power-good-digital signal is also low. When the power-good-digital signal goes from low to high, the tag is out of the reset mode.

20 Claims, 8 Drawing Sheets

(51) Int. Cl.
*G06F 1/3234* (2019.01)
*H04B 1/7163* (2011.01)
*H04B 1/717* (2011.01)

(52) U.S. Cl.
CPC ......... *H04B 1/0475* (2013.01); *H04B 1/7174* (2013.01); *H04B 1/71632* (2013.01)

(56) References Cited

U.S. PATENT DOCUMENTS

| | | | |
|---|---|---|---|
| 6,311,081 B1 * | 10/2001 | Northcutt | H04W 52/0293 455/574 |
| 8,943,352 B1 * | 1/2015 | Warneke | G06F 1/3234 713/500 |
| 2004/0214522 A1 | 10/2004 | Santhoff et al. | |
| 2005/0047480 A1 | 3/2005 | Carbonari | |
| 2008/0019424 A1 | 1/2008 | Green et al. | |
| 2009/0189741 A1 * | 7/2009 | Rowland | A61B 5/0031 340/10.4 |

OTHER PUBLICATIONS

Written Opinion dated Aug. 9, 2016, in International Patent Application No. PCT/US2016/029858, filed Apr. 28, 2016 (7pgs).

* cited by examiner

FIG. 8

POWER-GOOD DETECTOR FOR ULTRA-WIDE BAND TRANSMITTER WITH EMPHASIS ON LOW POWER CONSUMPTION

CROSS-REFERENCE TO RELATED APPLICATIONS

This is a US National Phase Patent Application claiming priority to International PCT Patent Application No. PCT/US2016/029858, entitled, "application claims priority to U.S. Provisional Patent Application No., entitled "POWER-GOOD DETECTOR FOR ULTRA-WIDE BAND TRANSMITTER WITH EMPHASIS ON LOW POWER CONSUMPTION," listing Harish S. Muthali, Kourosh Pahlavan, and Ari Vauhkonen as inventors, and filed Apr. 28, 2016, which claims priority to U.S. Provisional Patent Application No. 62/154,872, entitled "POWER-GOOD DETECTOR FOR ULTRA-WIDE BAND TRANSMITTER WITH EMPHASIS ON LOW POWER CONSUMPTION," listing Harish S. Muthali, Kourosh Pahlavan, and Ari Vauhkonen as inventors, and filed Apr. 30, 2015, which applications are hereby incorporated herein by reference in their entireties.

BACKGROUND

A. Technical Field

The present invention relates to signal transmitters, and more particularly, to ultra-broad-band (UWB) transmitters.

B. Background of the Invention

UWB is a radio technology that is used at a very low energy level for short-range, high-bandwidth communications using a large portion of the radio spectrum. Recently, UWB has been applied to collect target sensor data, locate and track target sensors with high precision. UWB communications offers many advantages. For instance, UWB signals are more difficult to detect than narrowband (essentially single frequency) signals and thus, the combination of broad spectrum, low power, and extremely short pulses also cause much less interference with other devices than do conventional narrowband wireless systems. Also, UWB is much more resistant to electrical interference from other devices than other wireless technology. Thus, UWB's data capacity, speed, low power requirements, and resistance to interference make it attractive as a communications technology.

Typically, the conventional UWB transmitter starts sending beacons/pulses immediately when the user enables the transmitter. Furthermore, the conventional UWB transmitter does not have an electrical component that is designed to check whether the internal chip of the UWB transmitter is enabled properly before the transmitter starts sending beacons. As such, there is a strong need for a transmitter architecture that keeps the transmitter in a deep sleep mode (ultra low power mode) before activation/enabling and, upon activation, allows the engineer to check whether the transmitter is enabled properly before it starts sending beacons.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

In the following description, for the purposes of explanation, specific details are set forth in order to provide an understanding of the invention. It will be apparent, however, to one skilled in the art that the invention can be practiced without these details. One skilled in the art will recognize that embodiments of the present invention, described below, may be performed in a variety of ways and using a variety of means. Those skilled in the art will also recognize additional modifications, applications, and embodiments are within the scope thereof, as are additional fields in which the invention may provide utility. Accordingly, the embodiments described below are illustrative of specific embodiments of the invention and are meant to avoid obscuring the invention.

A reference in the specification to "one embodiment" or "an embodiment" means that a particular feature, structure, characteristic, or function described in connection with the embodiment is included in at least one embodiment of the invention. The appearance of the phrase "in one embodiment," "in an embodiment," or the like in various places in the specification are not necessarily all referring to the same embodiment.

Furthermore, connections between components or between method steps in the figures are not restricted to connections that are effected directly. Instead, connections illustrated in the figures between components may be modified or otherwise changed through the addition thereto of intermediary components, without departing from the teachings of the present invention.

Figure 1:
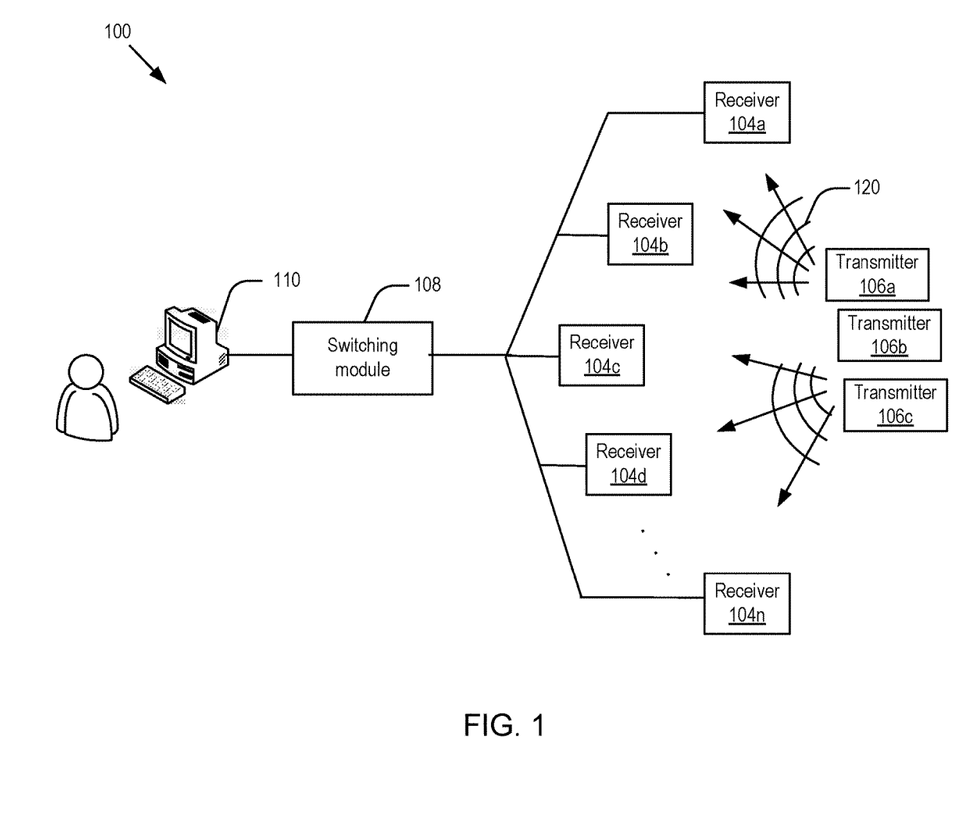
FIG. 1 shows a schematic diagram of an exemplary UWB communication system according to one embodiment of the present invention.

FIG. 1 shows a schematic diagram of an exemplary UWB communication system 100 according to one embodiment of the present invention. As depicted, one or more UWB transmitters 106a-106c may transmit UWB signals/beacons 120 to one or more receivers 104a-104n. The output signals from the receivers 104a-104n may be sent to a switching module 108, such as power-over-Ethernet switch, where the switching module 108 may control the data flow from the receivers 104a-104n to a server 110, such as computer. For instance, the switching module 108 may be coupled to the server 110 via a single cable for transmitting data from and providing electrical power to the receivers 104a-104n.

It should be noted that any suitable number of UWB transmitters may be included in the system 100. Likewise, it should be noted that any suitable number of UWB receivers may be included in the system 100. In embodiments, each of the transmitters 106a-106c may be a tag that is able to transmit UWB signals at a preset frequency. In embodiments, using the UWB signals received by the receivers 104a-104n and the triangulation technique, the exact locations of the transmitters 106a-106c may be determined.

Figure 2A:
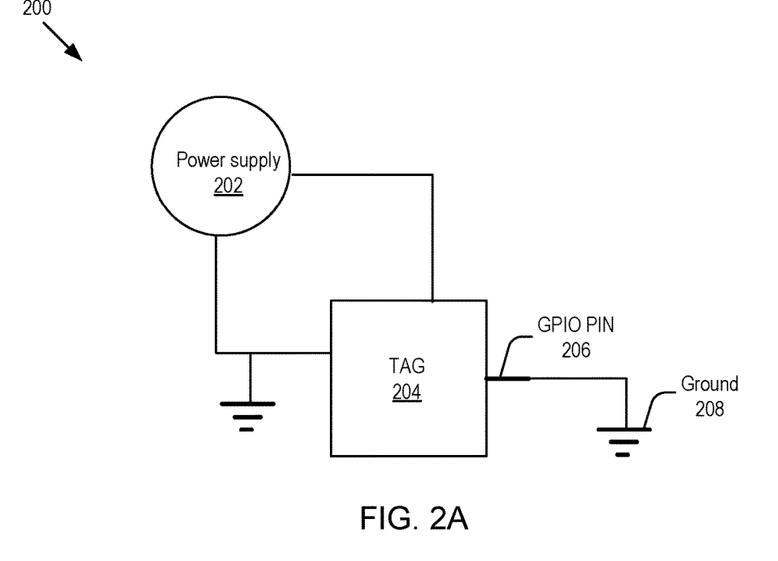
FIGS. 2A and 2B show an enabling process of a UWB transmitter according to one embodiment of the present invention.
Figure 2B:
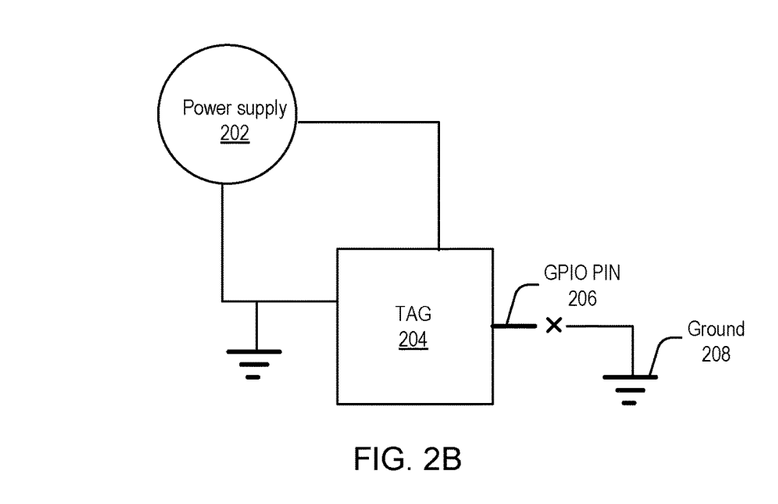

FIGS. 2A and 2B show an enabling process of a UWB transmitter 200 according to one embodiment of the present invention. As depicted, the UWB transmitter 200 includes: a tag 204; and a power supply 202, such as battery, for providing electrical power to the tag 204. (It is noted that the tag 204 may have a power supply, i.e., the term tag may collectively refer to both the power supply 202 and tag 204.) Before the user activates/enables the tag 204, the tag 204 may be in a deep sleep mode and connected to the ground 208 via a general-purpose-input-output (GPIO) pin 206, as shown in FIG. 2A. When the GPIO pin 206 is disconnected (i.e., the connection is open) from the ground 208 as shown in FIG. 2B, the tag 204 may be enabled and start sending beacons after an internal low-drop-out (LDO) regulator of the tag wakes up.

Figure 3:
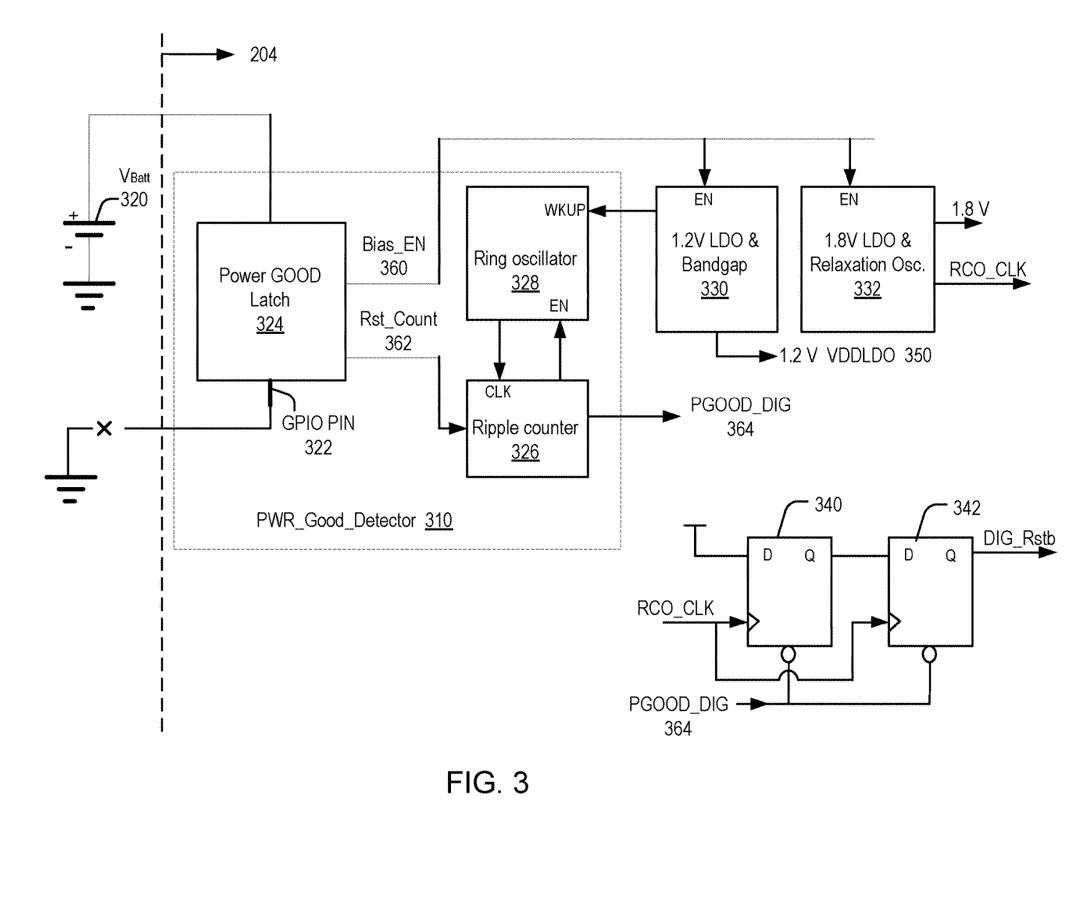
FIG. 3 shows the circuit topology of the power good detector employed in the UWB transmitter in FIGS. 2A and 2B.

It is noted that, unlike the conventional UWB transmitter, the GPIO pin 206 of the present invention may be used to check whether the internal circuit/chip of the tag 204 is enabled properly. FIG. 3 shows a circuit topology of a power_good_detector employed in the UWB transmitter 200 in FIGS. 2A and 2B. As depicted, the tag 204 may be powered by the power supply 320, such as battery, and the GPIO pin 322 (or 206) is connected to the ground before enabling. When the user disconnects the GPIO pin 322 from the ground, the electrical components of the tag 204 are activated to receive/transmit signals.

As depicted in FIG. 3, the tag 204 may include: a power-good-detector (PWR_good_detector) 310; a first regulator 330, such as 1.2 V LDO & bandgap regulator, that is directly connected to the power supply 320 and sends its output signal VDDLDO 350 (which is maintained at a preset voltage level, such as 1.2 volt); a second regulator 332, such as 1.8 V LDO & relaxation oscillator, that is directly connected to the power supply 320 and maintains its output voltage level at 1.8 volt; and two flip-flops 340 and 342. It is noted that the tag 204 may include other suitable number and types of electrical components that have similar functions as the PWR_good_detector 310, regulators 330 and 332, and flip flops 340 and 342. It is also noted that the regulators 330 and 332 may be replaced by other regulators that operate at other voltage levels.

The PWR_good_detector 310 includes: a power-good-latch 324; a ring oscillator 328; and a ripple counter 326. Upon disconnecting the GPIO pin 322 from the ground, the power-good-latch 324 sends a Bias_EN signal 360 to the regulators 330 and 332 and a reset count (Rst_count) signal 362 to the ripple counter 326 so that the ripple counter resets counting the clock signal transmitted by the ring oscillator 328. Upon receipt of the Bias_EN signal 360, the first regulator 330 generates 1.2 V output signal and transmits a wakeup (WKUP) signal to the ring oscillator 328. Then, the ring oscillator 328 starts sending the clock signals to the ripple counter 326. When the counted clock signals reach a preset value or a threshold value of the ripple counter, the ripple counter 326 sends the power-good-digital (PGOOD_DIG) signal 364 to the flip flops 340 and 342.

The Bias_EN signal 360 transmitted by the power-good-latch 324 also enables the second regulator 332 so that the second regulator starts generating 1.8 V output signal and transmits a ripple-clock-output (RCO_CLK) signal to the two flip flops 340 and 342. Using the input signals, PGOOD_DIG and RCO_CLK, the pair of lip flops 340 and 342 generates and transmits a digital-reset-bar (DIG_Rstb) signal. When the digital components of the tag 204 are in the reset mode, the DIG_Rstb signal is low and PGOOD_DIG signal 364 is also low. When the PGOOD_DIG signal 364 goes from low to high, the DIG_Rstb signal also goes to high, indicating that the digital components of the tag 204 are out of the reset mode.

Figure 4:
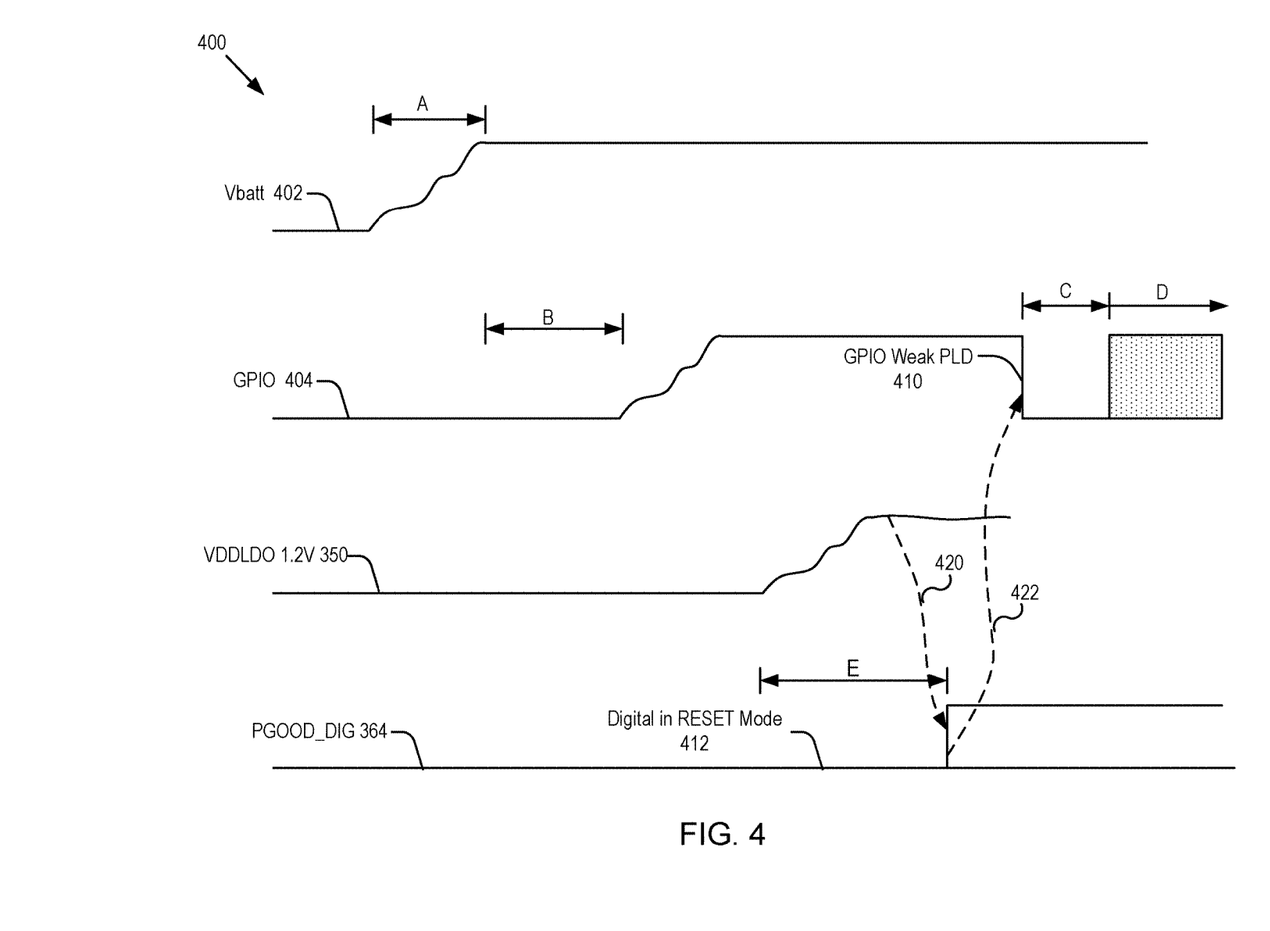
FIG. 4 shows an exemplary internal circuit timing diagram of the UWB transmitter in FIG. 3 according to one embodiment of the present invention.

FIG. 4 shows an exemplary internal circuit timing diagram 400 of the UWB transmitter 204 in FIG. 3 according to one embodiment of the present invention. The Vbatt signal 402 represents the voltage potential applied to the tag 204. When the power supply 320 is connected to the tag 204, Vbatt reaches its steady state after a transition time period, A. In embodiments, the time interval A ranges 10-100 msec. It is noted that the voltage at the steady state and the transition time period may vary depending on the type of power supply and the components of the tag 204.

The GPIO signal 404 represents the signal from the GPIO pin 322. In embodiments, the GPIO signal 404 is the voltage potential measured at the GPIO pin 322. As discussed above, the GPIO pin 322 is used for dual purposes: (1) the user enables the tag by breaking the connection between the GPIO pin and the ground, and (2) the engineer may read the GPIO signal to check whether the tag is properly enabled. The time interval B represents the time internal between the time when the Vbatt signal reaches it steady state and the time when the user can break the connection to enable the tag. In embodiments, the time interval B ranges 2-3 msec.

The VDDLDO signal 350 represents the output signal 350 from the first regulator 330 (1.2 V LDO & bandgap regulator). The VDDLDO signal 350 reaches its steady state after a transition time period. The arrow 420 indicates the internal process of the tag 204 after the first regulator 330 has reached its steady state: (1) the first regulator 330 sends a wakeup signal to the ring oscillator 328, (2) ring oscillator 328 starts sending clock signals to the ripple counter 326, and (3) the ripple counter 326 asserts the PGOOD_DIG signal 364 high when the counted clock signals reach a preset value or a threshold value of the ripple counter. The PGOOD_DIG signal 364 is the output signal from the ripple counter 326. As discussed above, when the PGOOD_DIG signal 364 is low, the components of the tag 204 are in the reset mode, i.e., all the digital logics remain in the reset mode. In embodiments, the time interval E, which is the time interval between the enabling point of the first regulator and the assertion point of the PGOOD_DIG signal, is about 500 μsec, where the time interval E is required for the first regulator 330 to go through a transient status and settle down to its normal operational status.

Upon lapse of a time interval after the PGOOD_DIG signal 364 is asserted high, the GPIO signal 404 goes to low, i.e., the GPIO pin voltage is pulled down, as indicated by the arrow 422. In FIG. 4, the general-purpose-IO_weak_pull_down signal (GPIO_weak_PLD) 410 causes the GPIO signal 404 to change from high to low. In embodiments, a GPIO may be included in the power-good-detector 310, as discussed in conjunction with FIG. 6.

The GPIO_weak_PLD signal 410 indicates that the tag 204 is enabled completely. As such, upon lapse of a preset time interval C, the GPIO pin 322 may be used for other purposes than checking whether the enabling process is properly completed, i.e., the GPIO pin 322 may be used for testing the operational status of the tag 204, for instance, during the time period D. In embodiments, the time interval C is about 5 mec.

Figure 5:
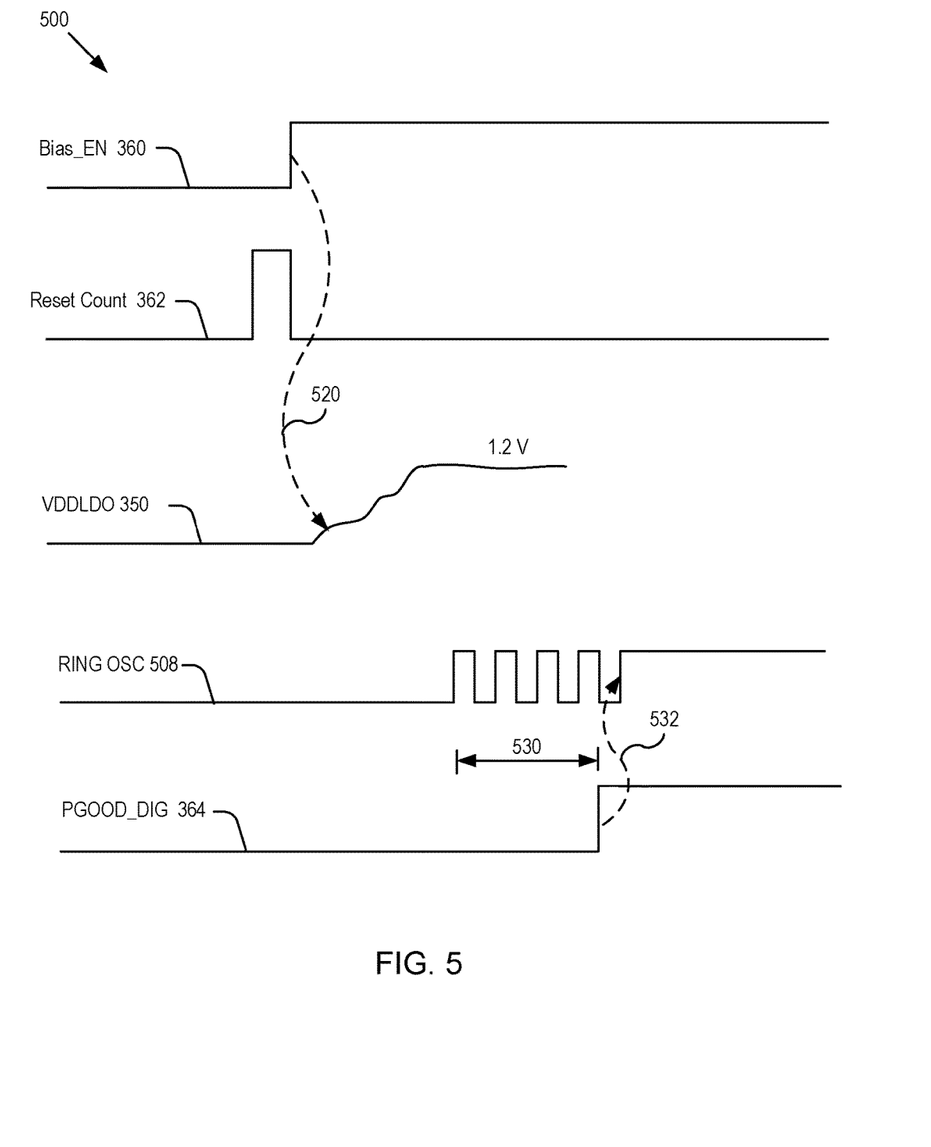
FIG. 5 shows an exemplary internal circuit timing diagram at the internal nodes of the power good detector in FIG. 3 according to one embodiment of the present invention.

FIG. 5 shows an exemplary internal circuit timing diagram 500 of the PWR_good_detector in FIG. 3 according to one embodiment of the present invention. The Bias_EN signal 360 is transmitted by the power-good-latch 324 to enable the first and second regulators 330 and 332. The reset count (Rst_Count) signal 362 is transmitted by the power-good-latch 324 to the ripple counter 326 to reset counting the clock signal. The VDDLDO 350 signal is the output signal from the first (1.2 V LDO & bandgap) regulator 330 and used to provide electrical power to clocks and other components of the tag 204. As indicated by the arrow 520, the Bias_EN signal 360 enables the first regulator 330 so that the first regulator starts generating the output signal at a preset voltage level, such as 1.2 V. The RING_OSC signal 508 is the output signal from the ring oscillator 328. The PGOOD_DIG signal 364 refers to the output signals from the ripple counter 326. As indicated by the arrow 532, the ripple counter 326 asserts the PGOOD_DIG signal 364 high when the counted clock signals during the time interval 530 reach a preset value or a threshold value of the ripple counter.

Figure 6:
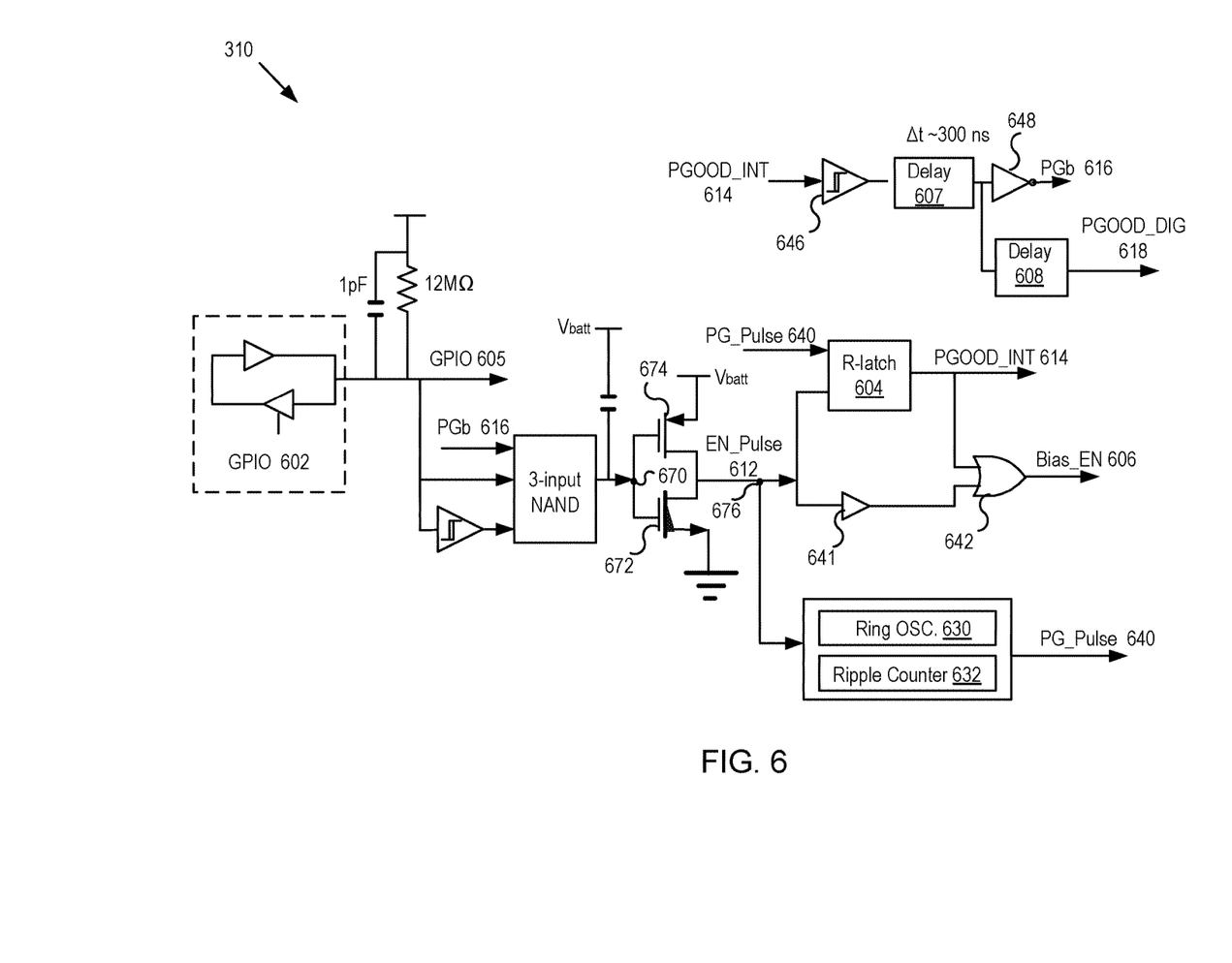
FIG. 6 shows an exemplary circuit topology of the power-good-detector in FIG. 3.

FIG. 6 shows an exemplary circuit topology of the PWR_good_detector 310 in FIG. 3. As depicted, the ring oscillator 630 and ripple counter 632 correspond to the ring oscillator 328 and ripple counter 326, respectively. The ring oscillator 630 and the ripple counter 632 may serve as a timer that counts for a preset time interval (740 in FIG. 7) before a signal is sent (as indicated by the arrow 730 in FIG. 7) to change the status of the PGOOD_INT signal 614. The GPIO 602 changes the GPIO signal 605 (which corresponds to the GPIO signal 404 in FIG. 4) from high to low when the tag 300 is enabled, where the GPIO_weak_PLD signal 410 in FIG. 4 represents the assertion of the GPIO signal to low state. The Bias_EN signal 606 corresponds to the Bias_EN signal 360 in FIG. 3.

It is noted that the PWR_good_detector 600 includes two delay circuits 607 and 608, where it should be apparent to those of ordinary skill in the art that the delay time intervals of the two delay circuits 607 and 608 may be set to any suitable values. The delay circuit 608 transmits an out signal, PGOOD_DIG 618, which corresponds to the PGOOD_DIG 364 in FIG. 5.

During the battery voltage ramp up, the node 676 may be driven to the ground voltage (0 Volt) by the transistor 672, which may be a low threshold NMOS transistor. The node 670 may be charged up during the battery voltage ramp up and the 3-input NAND may ensure that the node 670 is pulled up to sully voltage. Pulling down the voltage at node 676 may ensure that the R-latch 604 does not see a false trigger.

Figure 7:
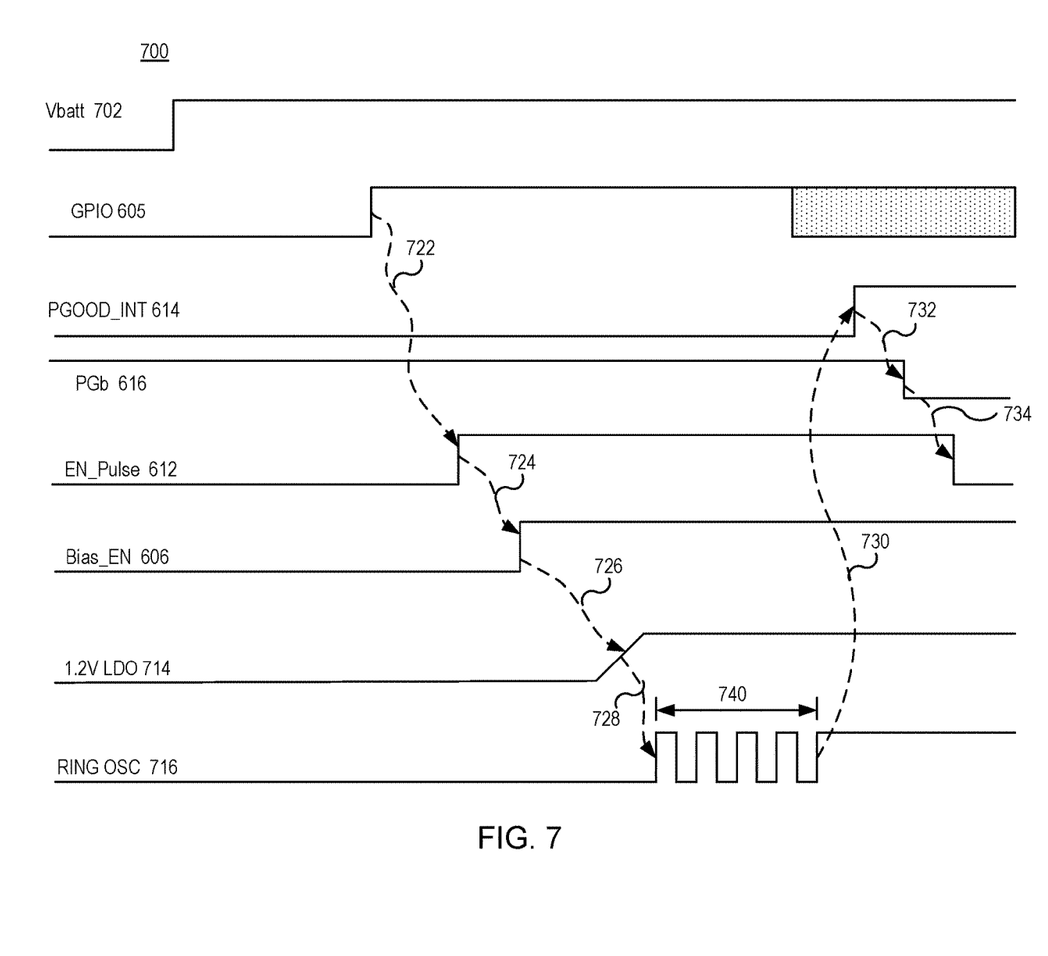
FIG. 7 shows an exemplary internal circuit timing of the power-good-detector in FIG. 6 according to one embodiment of the present invention.

FIG. 7 shows an exemplary internal circuit timing 700 of the PWR_good_detector 310 in FIG. 6 according to one embodiment of the present invention. As depicted, the Vbatt signal 702 represents the voltage potential applied to the PWR_good_detector 310 and corresponds to the Vbatt signal 402 in FIG. 4. The 1.2 V VLDO signal 714 and RING_OSC signal 716 represent the output signals from the first regulator (1.2V VLDO & bandgap) 330 and the ring oscillator 328 in FIG. 3, respectively. The GPIO signal 605, PGOOD_INT (Power_ good_ interrupt) signal 614, PGb signal 616, and Bias_EN signal 606 are the output signals from the GPIO 602, R-latch 604, inverter 648, and OR-gate 642, respectively. EN_Pulse signal 612 represents the signal at the node 676, where the node is coupled to the PMOS (p-type metal-oxide-semiconductor) transistor 674 and the low threshold NMOS transistor 672.

The arrows 722, 724, 726, and 728 indicate the flow of signals among the corresponding components of the PWR_good_detector 310. For instance, the arrow 724 indicates that a state change in the EN_Pulse signal 612 causes a state change in the Bias_EN signal 606. Thus, the time interval between the starting and ending points of the arrow 724 represents the time for the R-latch 604, amplifier 641, and OR-gate 642 to assert the Bias_EN signal 606 high in response to the state change in the EN_Pulse signal 612. Likewise, the arrows 730, 732, and 734 indicate the flow of signals among the corresponding components of the PWR_good_detector 310. For instance, the time interval between the starting and ending points of the arrow 732 represents the time for the amplifier 646, delay circuit 607, and inverter 648 to assert the PGb signal 616 low in response to the state change in the PGOOD_INT signal 614.

Figure 8:
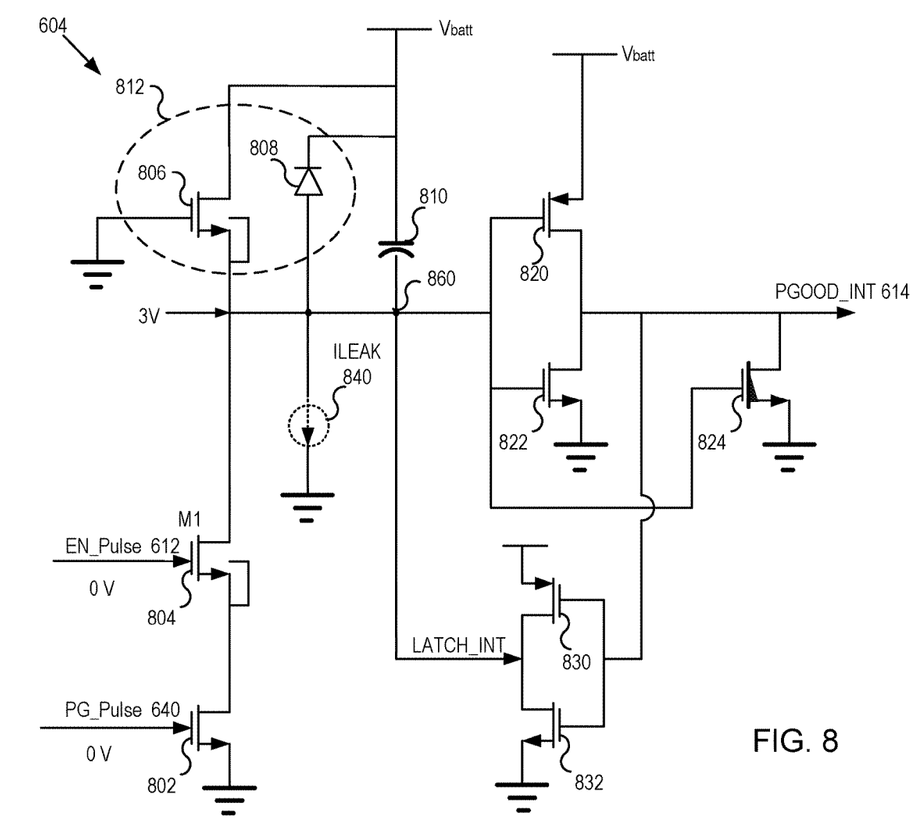
FIG. 8 shows an exemplary circuit topology of the R-latch in FIG. 6.

FIG. 8 shows an exemplary circuit topology of the R-latch 604 in FIG. 6. As shown in FIG. 8, the R-latch 604 includes: a current leak (ILEAK) 840 that represents the current leak through the transistors 804 and 832; a leakage compensating unit 812 that has an NMOS (n-type metal-oxide-semiconductor) in deep N-well 806 and a diode 808 and is able to compensate the current leakage 840; an NMOS in deep N-well 804; a metal-oxide-semiconductor field-effect transistor (MOSFET) 802; a capacitor 810; inverters 820 and 822; and three transistors 830, 832, and 824, where the transistor 824 is a low threshold voltage transistor. The R-latch 604 receives two input signals EN-Pulse 612 and PG_Pulse 640 and transmits the PGOOD-INT signal 614.

In embodiments, the R-latch 604 is a positive feedback latch and wakes up in a known state, i.e., the node 860 is at the voltage of the power supply, Vbatt, upon application of Vbatt to the PWR_Good_Detector 310, where this feature is accomplished by the capacitor 810.

The R-latch 604 may be immune to the current leakage 840 since the leakage compensation unit 812 may compensate the leakage. In embodiments, the current leakage at the transistor 804 may be minimized since it is placed in a deep N well and the bulk node for the P-bulk is directly coupled to the source so that the source of the transistor 804 is also charged up to the level close to the power supply voltage, such as Vbatt, on power up.

Also, the low threshold voltage transistor 824 may compensate the trip point variation of the inverters 820 and 822 so that the R-latch 604 may be immune to the inverter trip point variation.

One skilled in the art will also recognize that various embodiments may be implemented for ultra-broad-band (UWB) transmitters. The foregoing description of the invention has been described for purposes of clarity and understanding. It is not intended to limit the invention to the precise form disclosed. Various modifications may be possible within the scope and equivalence of the appended claims.

The invention claimed is:

1. An ultra-broad-band (UWB) transmitter tag comprising:
   a latch coupled to ground via a pin, the latch sends a bias enabling signal and a reset count signal after the pin is disconnected from ground;
   a first regulator coupled to the latch, the first regulator receives the bias enabling signal and transmits a wakeup signal;

an oscillator coupled to the first regulator, the oscillator receives the wakeup signal and sends at least one clock signal; and a counter coupled to the latch and the oscillator, the counter counts the at least one clock signal, when the at least one clock signal reaches a threshold value, the counter sends a signal to enable the UWB transmitter tag.

2. The UWB transmitter tag of claim 1 further comprising a second regulator coupled to the latch, the second regulator receive the bias enabling signal and transmit a ripple-clock-output signal.

3. The UWB transmitter tag of claim 2 further comprising at least one flip flop coupled to the counter and the second regulator, the at least one flip flop receives both the ripple-clock-output signal and the power-good-digital signal and generates a digital-reset-bar signal.

4. The UWB transmitter tag of claim 3 wherein when the signal sent from the counter and the digital-reset-bar signal are low, the UWB transmitter tag is in a reset mode, wherein when the signal sent from the counter goes from low to high, the digital-reset-bar signal goes to high and indicates that the UWB transmitter tag is out of the reset mode.

5. The UWB transmitter tag of claim 2 wherein the second regulator is a 1.8 V low-dropout (LDO) and relaxation oscillator.

6. The UWB transmitter tag of claim 1 wherein the first regulator is a 1.2 V low-dropout (LDO) and bandgap oscillator.

7. The UWB transmitter tag of claim 1 wherein the counter counts the at least one clock signal for a preset time interval.

8. The UWB transmitter tag of claim 1 further comprising at least one delay circuit coupled to the counter to process the signal sent from the counter.

9. A method of enabling an ultra-broad-band (UWB) transmitter tag comprising:
sending a bias enabling signal from a latch connected to ground via a pin when the pin is disconnected from ground;
receiving, at a first regulator coupled to the latch, the bias enabling signal and transmitting a wakeup signal from the first regulator;
receiving, at an oscillator, the wakeup signal and sending at least one clock signal from the oscillator;
receiving and counting, at a counter, the at least one clock signal; and
sending from the counter a signal to enable the UWB transmitter tag when the at least one clock signal reaches a threshold value.

10. The method of claim 9 further comprising receiving, at a second regulator coupled to the latch, the bias enabling signal and transmit a ripple-clock-output signal from the second regulator.

11. The method of claim 10 further comprising receiving both the ripple-clock-output signal and the signal sent from the counter, at a flip flop coupled to both the counter and the second regulator, and generating a digital-reset-bar signal from the flip flop.

12. The method of claim 9 wherein the at least one clock signal is counted within a preset time interval.

13. The method of claim 9 further comprising pulling down the pin using a weak pull down signal after a time interval when the signal sent from the counter is high.

14. The method of claim 13 wherein the weak pull down signal indicates that the UWB transmitter tag is enabled completely.

15. A detector for enabling an ultra-broad-band (UWB) transmitter tag comprising:
a pin coupled to ground, the disconnection of the pin from the ground enabling an enabling pulse signal;
an oscillator and a counter receiving the enabling pulse signal and sending a pulse signal;
an R-latch coupled to the oscillator and the counter, the R-latch receives the enabling pulse signal and the pulse signal from the counter and transmits an interrupt signal; and
a logic gate receiving the enabling pulse signal and the interrupt signal to output a bias enabling signal for enabling the UWB transmitter tag.

16. The detector of claim 15 wherein the logic gate is an OR-gate.

17. The detector of claim 15 further comprising at least one delay circuit coupled to the R-latch to process the interrupt signal and generate an out signal for enabling the UWB transmitter tag.

18. The detector of claim 17 wherein the enabling pulse signal is the signal at a node coupled to a p-type metal-oxide-semiconductor (PMOS) transistor and a low threshold n-type metal-oxide-semiconductor (NMOS) transistor, the PMOS transistor coupled to a power source and the low threshold NMOS transistor coupled to ground.

19. The detector of claim 15 wherein the R-latch receives the enabling pulse signal via an n-type metal-oxide-semiconductor (NMOS) in deep N-well and receives the pulse signal via a metal-oxide-semiconductor field-effect transistor (MOSFET).

20. The detector of claim 19 wherein the R-latch further comprises a leakage compensating unit coupled to the NMOS in deep N-well, the leakage compensating unit compensates current leakage through the NMOS in deep N-well.

* * * * *